(12) United States Patent
Joshi

(10) Patent No.: US 6,633,030 B2
(45) Date of Patent: Oct. 14, 2003

(54) SURFACE MOUNTABLE OPTOCOUPLER PACKAGE

(75) Inventor: Rajeev Joshi, Cupertino, CA (US)

(73) Assignee: Fiarchild Semiconductor, South Protland, ME (US)

( * ) Notice: Subject to any disclaimer, the term of this patent is extended or adjusted under 35 U.S.C. 154(b) by 0 days.

(21) Appl. No.: 09/944,717

(22) Filed: Aug. 31, 2001

(65) Prior Publication Data

US 2003/0042403 A1 Mar. 6, 2003

(51) Int. Cl.[7] ............................................... H01L 31/00
(52) U.S. Cl. ..................................... 250/214.1; 250/239
(58) Field of Search ............................... 250/214.1, 551, 250/227.24, 239; 257/82, 81, 80, 790, 723, 738, 783; 438/25, 24, 119; 385/15, 14, 39; 228/180.22, 179.1, 215

(56) References Cited

U.S. PATENT DOCUMENTS

| | | | | |
|---|---|---|---|---|
| 4,445,043 A | | 4/1984 | Hill | |
| 4,450,461 A | * | 5/1984 | Cook et al. | 257/82 |
| 4,857,746 A | * | 8/1989 | Kuhlmann et al. | 438/24 |
| 5,203,075 A | * | 4/1993 | Angulas et al. | 29/830 |
| 5,545,893 A | | 8/1996 | Brown et al. | |
| 5,677,245 A | * | 10/1997 | Brown et al. | 438/25 |
| 6,324,072 B1 | * | 11/2001 | Lorenz et al. | 361/803 |
| 6,393,183 B1 | * | 5/2002 | Worley | 385/39 |

OTHER PUBLICATIONS

Fairchild Semiconductor, "Full Pitch Mini–Flat Package 4–Pin Optocouplers", www.fairchildsemi.com, (Apr. 03, 2001), 6 pgs.

Agilent Technologies, "Applications for Low Input Current, High Gain Optocouplers", Application Note 951–1, (1999), 4 pgs.

* cited by examiner

*Primary Examiner*—Kevin Pyo
*Assistant Examiner*—Seung C. Sohn
(74) *Attorney, Agent, or Firm*—Townsend, Townsend & Crew LLP

(57) ABSTRACT

An optocoupler package is disclosed. The optocoupler package comprises a carrier substrate and a plurality of conductive regions on the carrier substrate. An optoelectronic device, an optically transmissive medium, and a plurality of conductive structures can be on the carrier substrate.

19 Claims, 4 Drawing Sheets

SURFACE MOUNTABLE OPTOCOUPLER PACKAGE

BACKGROUND OF THE INVENTION

Optocouplers contain at least one optical emitter device which is optically coupled to an optical receiver device through an optically transmissive medium. This arrangement permits the passage of information from one electrical circuit that contains the optical emitter device to another electrical circuit that contains the optical receiver device. A high degree of electrical isolation is maintained between the two circuits. Because information is passed optically across an insulating gap, the transfer is one way. For example, the optical receiver device cannot modify the operation of a circuit containing the optical emitter device. This feature is important because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit.

A common optocoupler package format is the dual-in-line package or DIP. This package is widely used to house integrated circuits and is also used for conventional optocouplers. Various versions of optocoupler DIP packages having 4, 6, 8 or 16 pins are commonly manufactured.

FIG. 1 shows a cross section of a conventional optocoupler DIP package 10. The illustrated optocoupler 10 includes a lead frame 24 comprising leads 24(a), 24(b) (i.e., pins). An optical emitter device 12 is mounted on one lead 24(a). An optical receiver device 14 is mounted on the other lead 24(b). The optical receiver device 14 generates an electrical signal after receiving light generated by the optical emitter device 12. The optical emitter device 12 is electrically coupled to the lead 24(a) through its bottom surface, and to another lead (not shown) via a wire 11. Similarly, optical receiver device 14 is electrically coupled to the lead 24(b) through the bottom surface and to another lead (not shown) via a wire 13. It will be recognized by those skilled in the art that the optical emitter device 12 operates with two electrical connections, an anode and a cathode. These connections are thus provided by the wire 11 and the lead 24(a). Similarly, optical receiver device 14 operates with two electrical connections, typically an emitter and a collector. These connections are provided by the wire 13 and lead 24(b). The optocoupler package 10 further includes an optically transmissive medium 16. A molding compound 18 encases the leadframe 24, optical emitter device 12, optical receiver device 14, and the optically transmissive medium 16.

A number of improvements could be made to the optocoupler package 10 shown in FIG. 1. For example, the optocoupler package 10 requires an expensive and time consuming overmolding process. In the overmolding process, the molding compound 18 encapsulates the other parts of the optocoupler package 10. In addition to the overmolding process itself, mold material removal processes (e.g., dejunk and deflash processes) are used to remove excess molding compound, thus adding to the time and expense of forming an optocoupler package. In addition, the tooling that is needed to create moldings of different "form factors" (e.g., 4, 6, or 8 pin packages) requires a significant capital investment. Accordingly, if the overmolding process could be eliminated, the time and costs associated with producing optocoupler packages could be reduced.

Other improvements to the optocoupler package 10 could also be made. The optocoupler package 10 is also prone to failure from thermal cycling. For example, the difference in the thermal expansion properties of the molding compound 18 and the optically transmissive medium 16 causes them to expand and contract at different rates when they are heated and cooled. The molding compound 18 and the optically transmissive medium 16 could potentially separate, thus resulting in a structurally weak package. Temperature cycling also produces stress at the points where the lead frame 24 exits the molding compound 18 (e.g., at point "A"). The stress can result in a broken or weakened lead frame 24. Also, the wires 11, 13 can sometimes pass through the optically transmissive medium 16 and the molding compound 18. Differences in the thermal expansion properties of the optically transmissive medium 16 and the molding compound 18 can induce stress in the wires 11, 13 and can cause them to break.

It would also be desirable to reduce the height of conventional optocoupler packages. The optocoupler package 10 shown in FIG. 1 is relatively high. For example, the net height of a typical DIP package is about 3.5 to about 4.0 mm. It would be desirable to reduce the height of the optocoupler package so that it has a lower profile. By doing so, smaller electronic components could be produced.

Embodiments of the invention address these and other problems, individually and collectively.

SUMMARY OF THE INVENTION

Embodiments of the invention are directed to optocoupler packages, optocoupler assemblies, and methods for making the same.

One embodiment of the invention is directed to an optocoupler package comprising: a) a carrier substrate including a plurality of conductive regions; b) an optical emitter device on the carrier substrate; c) an optical receiver device on the carrier substrate; d) an optically transmissive medium disposed between the optical emitter device and the optical receiver device; and e) a plurality of solder structures on at least some of the conductive regions of the carrier substrate.

Another embodiment of the invention is directed to an optocoupler package comprising: a) a carrier substrate including a plurality of conductive regions; b) an optical emitter device on the carrier substrate; c) a first wire coupling the emitter device to at least one of the plurality of conductive regions; d) an optical receiver device on the carrier substrate, wherein the optical receiver device is adapted to receive radiation from the emitter device; e) a second wire coupling the optical receiver device to at least one of the conductive regions; f) an optically transmissive medium disposed on and between the optical emitter device and the optical receiver device; and g) a plurality of solder structures on at least some of the conductive regions in the plurality of conductive regions and wherein each of the solder structures includes a dimension greater than the heights of the optical receiver device and the optical emitter device.

Another embodiment of the invention is directed to an optocoupler apparatus comprising: a) a circuit substrate comprising a first plurality of conductive regions; and b) an optocoupler package comprising (i) a carrier substrate, (ii) a second plurality of conductive regions on the carrier substrate, (iii) an optical receiver device on the carrier substrate, (iv) an optical emitter device on the carrier substrate, (v) an optically transmissive medium disposed between the optical emitter device and the optical receiver device, and (vi) a plurality of solder structures on at least some of the second plurality of conductive regions of the carrier substrate, wherein the optocoupler package is mounted to the circuit substrate.

Another embodiment of the invention is directed to a method for forming an optocoupler package comprising: a) mounting an optical emitter device on the carrier substrate with a plurality of conductive regions; b) mounting an optical receiver device on the carrier substrate; c) forming an optically transmissive medium disposed on the optical receiver device and the optical emitter device; and d) forming a plurality of solder structures on at least some of the conductive regions of the carrier substrate.

Another embodiment of the invention is directed to a method for forming an optocoupler apparatus comprising: a) forming the optocoupler package according to the method of described above; and b) mounting the optocoupler package to a circuit substrate.

Another embodiment of the invention is directed to a surface mountable optocoupler package comprising: a) a carrier substrate including a plurality of conductive regions; b) an optical emitter device on the carrier substrate; c) an optical receiver device on the carrier substrate; d) an optically transmissive medium disposed between the optical emitter device and the optical receiver device; and e) a plurality of conductive structures on at least some of the conductive regions of the carrier substrate, wherein the surface mountable optocoupler package is capable of being mounted to a circuit structure These and other embodiments of the invention are described in further detail below with reference to the Drawings.

BRIEF DESCRIPTION OF THE DRAWINGS

FIG. 4(*e*) shows an optocoupler apparatus according to an embodiment of the invention.

DETAILED DESCRIPTION

One embodiment of the invention is directed to an optocoupler package. The optocoupler package comprises a carrier substrate with a plurality of conductive regions. Optoelectronic devices such as an optical emitter device and an optical receiver device are on the carrier substrate. An optically transmissive medium is disposed on and between the optical emitter device and the optical receiver device. Solder structures (or other conductive structures) are present on at least some of the conductive regions on the carrier substrate. The resulting package can be flipped over and mounted onto a circuit substrate such as a circuit board. The solder structures can communicate facing conductive regions (e.g., conductive pads) of the circuit substrate and of the carrier substrate. Accordingly, some embodiments of the invention can be used as a BGA (ball grid array) type package.

Many of the specific embodiments discussed with reference to the figures use solder structures (e.g., solder balls) on a carrier substrate. However, it is understood that the solder structures could be replaced by other suitable conductive structures including conductive columns (e.g., electroplated columns such as electroplated copper columns). Any suitable conductive structure can be used in the optocoupler package to electrically couple the carrier substrate to a circuit substrate in embodiments of the invention.

Figure 1:
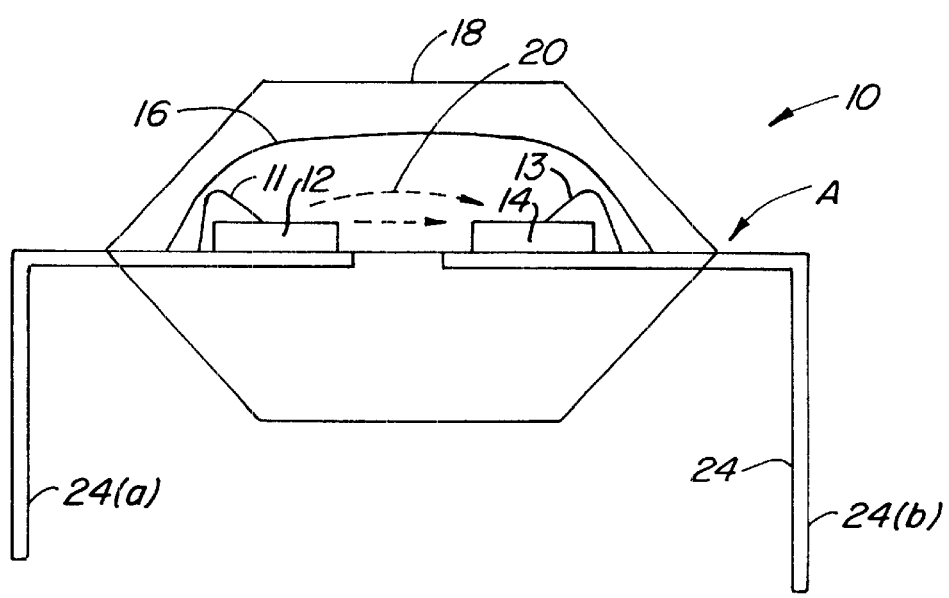
FIG. 1 shows a side cross-sectional view of a conventional optocoupler package.
Figure 2:
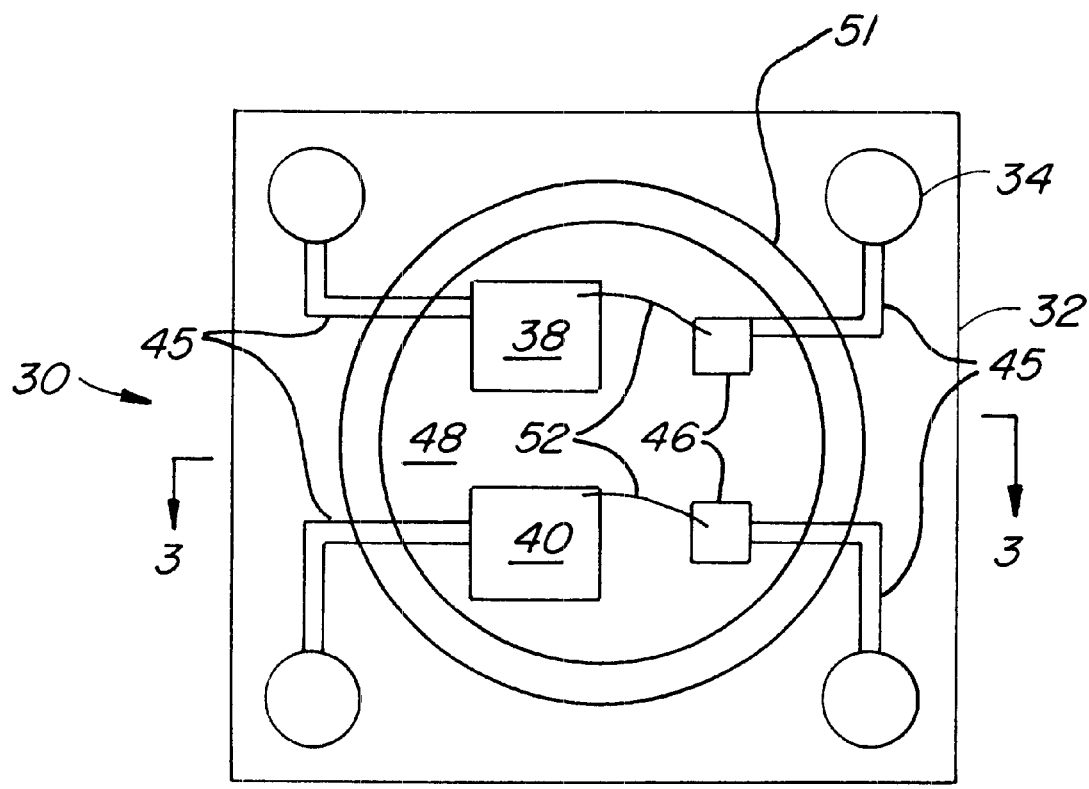
FIG. 2 shows a plan view of an optocoupler package according to an embodiment of the invention.

FIG. 2 shows an optocoupler package 30 according to an embodiment of the invention. The optocoupler package 30 includes a carrier substrate 32 with an optical emitter device 38 and an optical receiver device 40. In this example, both the optical emitter device 38 and the optical receiver device 40 can be in a side-by-side relationship and may be substantially coplanar. They can be positioned on the carrier substrate 32 so that the receiver device 40 receives radiation from the emitter device 38.

Any suitable optoelectronic device can be used in embodiments of the invention. For example, the optical emitter device 38 may be fabricated from silicon or gallium arsenide and can emit radiation (e.g., infrared, visible) that can be detected by the optical receiver device 40. An example of an optical emitter device is an LED (light emitting diode) device. Examples optical receiver devices 40 include phototransistors and photodetector diodes. The optical receiver device 40 may also be formed from a semiconductor material such as silicon.

The carrier substrate 32 and the optocoupler package 30 can have any suitable dimensions. For example, the carrier substrate 32 can have planar dimensions less than about 10×10 mm$^2$ (3.5×3.5 mm$^2$). When mounted on a circuit substrate, the height of the optocoupler package 30 can be less than the height of a conventional DIP type package (e.g., less than about 3.5 or 3.0 mm in height). In an exemplary embodiment, the maximum height of the optocoupler package 30 can be about 1.25 mm (i.e., carrier substrate height plus solder structure height) or even 1.0 mm when it is mounted on a circuit substrate. For example, the carrier substrate 32 can be about 0.25 mm thick, while the solder structures 34 can be about 1.00 mm in height for a total package height of about 1.25 mm. Preferably, the heights of the solder structures are greater than the thicknesses of the optical emitter device and the optical receiver device. As compared to conventional DIP type packages, embodiments of the invention have a lower profile and occupy less space. Accordingly, various electronic components using embodiments of the invention can be made smaller than electronic components using conventional DIP type packages.

An optically transmissive medium 48 can cover the optical emitter device 38, the optical receiver device 40, and the wires 52. The optically transmissive medium 48 may comprise an optical grade, silicone die coat material (e.g., a "glob top" type encapsulant). In some embodiments, the area over which the optically transmissive medium 48 is spread can be on the order of millimeters (e.g., less than about 1.6×1.6 mm$^2$). In FIG. 2, a reflective coating 88 is on the optically transmissive medium 48. Reflective coatings are described in further detail below.

A dam structure 51 can be used to confine a liquid or semi-solid precursor for the optically transmissive medium 48. It can be disposed around the optically transmissive medium 48, and also around the optical emitter device 38 and the optical receiver device 40 in a line. The dam structure 51 can be left in the optocoupler package 30 or can be removed after the optically transmissive medium 48 is formed. In other embodiments, a dam may not be necessary if the mechanical properties (e.g., the surface tension and viscosity) of the material forming optically transmissive medium are sufficient to form an appropriate shape (e.g., a dome shape).

A plurality of solder structures 34 are disposed around the optical emitter device 38 and the optical receiver device 40. The solder structures 34 may be, for example, solder balls. Exemplary solder balls can have a radius on the order of about 1 mm (e.g., 0.75 mm) or less. The solder structures 34 may act as input/output terminals for the optical emitter device 38 and the optical receiver device 40. The solder structures 34 on the carrier substrate 32 can have any suitable pitch. For example, in some embodiments, the average pitch can be about 2.5 mm or less. When the carrier substrate 32 is flipped over and mounted to a circuit substrate, the solder structures 34 space the circuit substrate (not shown) from the carrier substrate 32.

The carrier substrate 32 includes a plurality of conductive regions. The plurality of conductive regions includes conductive regions (not shown) under the solder structures 34, under the optical emitter device 38, under the optical receiver device 40, and the conductive regions 46 adjacent to the optical emitter device 38 and the optical receiver device 40. Any of the conductive regions may be, for example, conductive pads made of copper, gold, etc.

The conductive regions 46 adjacent to the optical emitter device 38 and the optical receiver device 40 may be coupled together with bonding wires 52. Conductive lines 45 can be used to electrically couple the solder structures 34 to the conductive regions 46, the optical emitter device 38, and the optical receiver device 40.

The embodiment shown in FIG. 2 is but one example of an embodiment of the invention. Although a particular arrangement of conductive lines and conductive regions is shown in FIG. 2, it is understood that conductive lines and conductive regions can be of any suitable size, and in any suitable configuration in embodiments of the invention. Also, although the embodiment shown in FIG. 2 has one optical emitter device 38, one optical receiver device 40, and four solder structures 34, it is understood that in embodiments of the invention, any suitable number of optoelectronic devices and any suitable number of solder structures (in any suitable arrangement) may be present in the optocoupler package.

Figure 3:
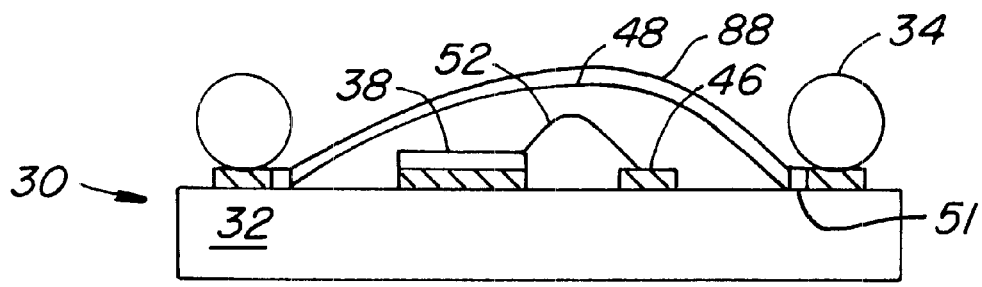
FIG. 3 shows a cross-sectional view of the optocoupler package shown in FIG. 2, along the line 3—3.

FIG. 3 shows a side cross-sectional view of the optocoupler package 30 shown in FIG. 2. As shown in FIG. 3, the height of the optically transmissive medium 48 in this embodiment does not exceed the heights of the solder structures 34 (on conductive regions of the carrier substrate 32). Each of the solder structures 34 can also have a dimension greater than the thickness of the optical receiver device and the optical emitter device 38. When the optocoupler package 30 is mounted to a circuit substrate (not shown), the solder structures space the circuit substrate from the carrier substrate 32.

Exemplary methods for forming the optocoupler package 30 shown in FIGS. 2 and 3 can be described with reference to FIGS. 4(a) to 4(d). An exemplary method for forming an optocoupler apparatus 100 including the optocoupler package 30 can be described with reference to 4(e).

Figure 4A:
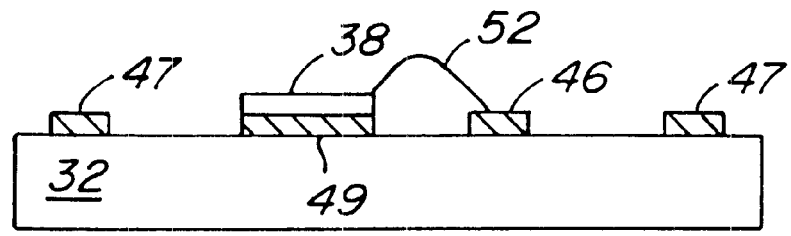
FIGS. 4(*a*) to 4(*d*) show cross-sections of various structures that are used in forming an optocoupler package according to an embodiment of the invention.

FIG. 4(a) shows an optical emitter device 38 mounted on a conductive region on a carrier substrate 32. Preferably, the carrier substrate 32 comprises a ceramic material or a metallized ceramic material. Ceramic materials have favorable structural, thermal conductivity, and electrical insulation properties. The carrier substrate 32 may or may not include internal circuitry. An optical receiver device (not shown in FIG. 4(a)), may be disposed at the side of the optical emitter device 38. The optical emitter device 38 and the optical receiver device can be mounted to the carrier substrate 32 in any suitable manner known to those skilled in the art.

The carrier substrate 32 may also include a number of conductive regions and conductive lines in any suitable arrangement. In the example shown in FIG. 4(a), some conductive regions 47 are at the edge regions of the carrier substrate 32 and are disposed around the optical emitter device 32 and the optical receiver device (not shown). These conductive regions 47 can be, for example, conductive pads upon which solder structures will be formed. Inner conductive region 46 can also be a conductive pad. A wire 52 can be bonded to the inner conductive region 46 and also to the optical emitter device 38. A conductive region 49 is also under the optical emitter device 38.

The structure shown in FIG. 4(a) may be formed in any suitable manner. For example, in some embodiments, a plurality of the optical emitter devices may be formed in a semiconductor wafer (not shown). After forming the optical emitter devices, the semiconductor wafer can be diced using, for example, a dicing saw. After separating the optical emitter devices from each other, individual optical emitter devices can be mounted to carrier substrates in a sheet or strip of carrier substrates in any suitable manner. For example, the optical emitter devices can be die bonded to the carrier substrates. A die bonding technique including, for example, an epoxy or solder eutectic die attach technique may be used. Optical receiver devices may be formed and bonded to the carrier substrates in a similar manner.

When an optoelectronic device such as an optical emitter device is mounted on an individual carrier substrate, the carrier substrate may be one of a number of carrier substrates joined together in a sheet or strip. Tie bars or other structures may join the individual carrier substrates together in the sheet or strip. After one or more of the steps such as forming a dam structure, forming the optically transmissive medium, and forming the solder structures (all described in further detail below), the tie bars can be severed (e.g., with a cutting element such as a cutting blade) to separate the individual carrier substrates from each other and to form individual optocoupler packages. For simplicity of illustration, only one carrier substrate 32 is shown in FIGS. 4(a) to 4(d). It is understood that the optoelectronic packages according to embodiments of the invention could be fabricated sequentially on single carrier substrates or could be fabricated in parallel on many carrier substrates that are in a sheet or strip of carrier substrates.

After the optical emitter device 38 and the optical receiver device are mounted on the carrier substrate 32, a wire 52 (e.g., gold wires) may then be bonded to the optical emitter device 38 and a corresponding conductive region 46. Another wire (not shown) may be bonded to the optical receiver device and its corresponding conductive region. Wire bonding methods are well known in the art. For example, wires may be bonded to the optical receiver device, optical emitter device, or conductive regions of a carrier substrate using, for example, a thermosonic bonding process.

Figure 4B:
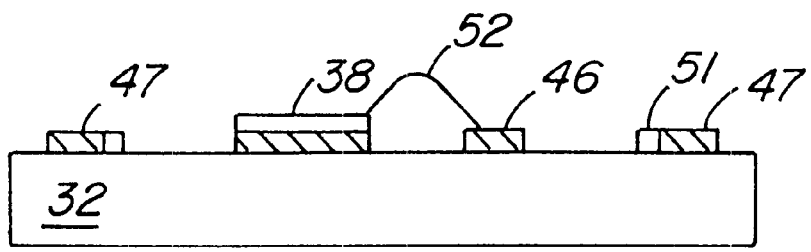

Referring to FIG. 4(b), a dam structure 51 can be formed on the carrier substrate 32. The dam structure 51 may comprise a ring of any suitable material that is formed around the optical emitter device 38 and the optical receiver device (not shown). The dam structure 51 provides a physical barrier for a subsequently deposited optically transmissive material or a precursor to an optically transmissive material. Any suitable material may be used in the dam structure 51. In some embodiments, an enclosed geometry (e.g., a circle) of epoxy material can be deposited on the carrier substrate 32 around the optical emitter device 38 and the optical receiver device, with an appropriate dispenser. The epoxy material can then be cured.

Figure 4C:
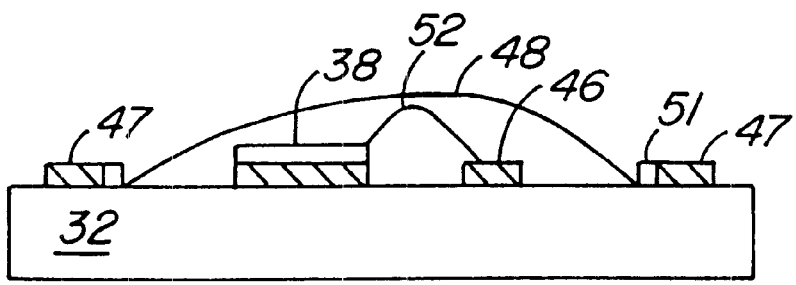
Figure 4D:
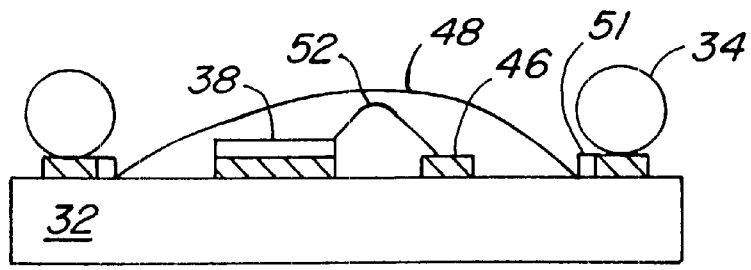

Referring to FIG. 4(c), after the dam structure 51 is formed, an optically transmissive material 48 can be formed within the dam structure 51. An optically transmissive material precursor such as a silicone liquid or gel can be deposited on the carrier substrate 32 and within the dam structure 51 using an appropriate dispenser. The dispenser may be, for example, a needle that dispenses liquid silicone onto the carrier substrate 32. The dam structure 51 inhibits the flow of the optically transmissive material precursor outwardly and confines the optically transmissive material precursor so that it does not reach the outer conductive regions 47. After the optically transmissive material precursor is deposited on the carrier substrate 32, the deposited silicone liquid may then be cured (e.g., heat cured) to a solid state to form the optically transmissive material 48.

After the optically transmissive material 48 is cured, a number of solder structures 34 can be formed on the outer conductive regions 47. The solder structures can include, for example, standard tin/lead solder (e.g., 63/37). The solder structures 34 can be formed in any suitable manner. For example, the solder structures 34 can be formed by depositing solder paste onto the conductive regions 47 (e.g., by stenciling). After depositing solder paste on the conductive regions, the solder paste can be reflowed to form solder balls. In an alternative embodiment, the solder structures can be formed by placing and bonding pre-formed solder balls onto the conductive regions 47.

Although processing steps in a particular order have been described with reference to FIGS. 4(a) to 4(d), it is understood that embodiments of the invention are not limited to the particular order of steps discussed. For example, in some embodiments, it is possible to form solder structures on the carrier substrate before forming an optically transmissive medium on the carrier substrate.

Figure 4E:
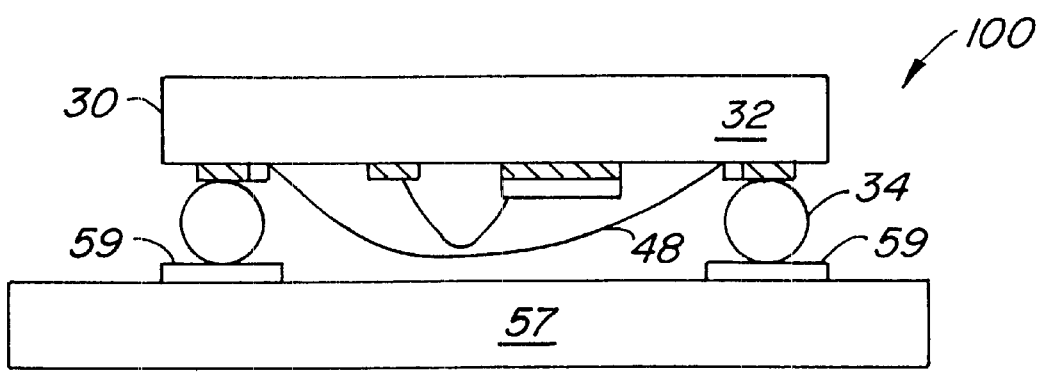

Referring to FIG. 4(e) after the solder structures 34 are formed on the conductive regions 47 of the carrier substrate 32, the formed optocoupler package 30 can be flipped over and surface mounted to a circuit substrate 57 to form an optocoupler apparatus 100. The solder structures 34 can be aligned with the conductive regions 59 of the circuit substrate 57 to bond the carrier substrate 32 to the circuit substrate 57. The circuit substrate 57 could be, for example, a printed circuit board.

In the illustrated embodiment, a gap is present between the optically transmissive medium 48 and the circuit substrate 57. The gap may be an empty space that is free of any material. Advantageously, the space allows the optically transmissive medium 48 to freely expand or contract during thermal cycling. For example, during the fabrication of the optocoupler package 30, the optically transmissive medium 48 can be subjected to heating and cooling during, for example, a solder reflow process. Also, when the optocoupler package 30 is in an optocoupler apparatus 100, the optocoupler package 30 may be subjected to various heating and cooling cycles during the operation of the electronic device in which the optocoupler apparatus 100 is employed. In both cases, the optically transmissive medium 48 can freely expand and contract, without being physically confined by an overmolding. Less stress is generated in the package. This results in a more reliable package.

In other embodiments, the gap between the optically transmissive medium 48 and the circuit substrate 57 could be filled with a material. For instance, a non-reflective material could be provided in the gap to reduce potential reflections of radiation from the optical emitter device off of any circuitry (not shown) in the circuit substrate 57. Alternatively, a reflective material could be coated on the optically transmissive medium 48 to help keep any emitted radiation within the optically transmissive medium 48. Such reflective coatings may include materials such as titanium dioxide.

At any suitable point in the method, the optocoupler package or precursor thereof may be tested, singulated, and packed. In a singulation process, the carrier substrate 32, if it is one of many in a sheet or strip of carrier substrates, (e.g., a single or strip of ceramic), can be separated from other carrier substrates in the sheet or strip by cutting.

Embodiments of the invention have a number of other advantages in addition to the advantages already mentioned above. For example, because a molding compound and pins are not needed in embodiments of the invention, problems associated with undue stress in the pins and bonding wires are eliminated or reduced. Also, an overmolding process using a molding material is not needed in embodiments of the invention. Eliminating the overmolding process and processes associated with the overmolding process reduces production costs and production time. This, in turn, results in a less costly package. In addition, because embodiments of the invention do not need to use molded materials and pins, specialized molds for different types of optocoupler packages (e.g., 4 pin, 6 pin, 8 pin, etc.) are not needed. This reduces the need to maintain specialized tooling for many different optocoupler packages of various "form factors". In addition, in embodiments of the invention, the carrier substrates can be supplied marked and kept in inventory as needed. Lastly, when the optocoupler packages are mounted on a circuit substrate, the optocoupler packages have a lower profile than the conventional optocoupler packages mentioned above. Consequently, smaller electronic components can be made using embodiments of the invention than using conventional DIP type optocoupler packages.

While the foregoing is directed to certain preferred embodiments of the present invention, other and further embodiments of the invention may be devised without departing from the basic scope of the invention. Such alternative embodiments are intended to be included within the scope of the present invention. Moreover, the features of one or more embodiments of the invention may be combined with one or more features of other embodiments of the invention without departing from the scope of the invention.

What is claimed is:

1. An optocoupler package comprising:
    a) a carrier substrate including a plurality of conductive regions;
    b) an optical emitter device on the carrier substrate;
    c) an optical receiver device on the carrier substrate;
    d) an optically transmissive medium disposed between the optical emitter device and the optical receiver device; and
    e) a plurality of solder structures on at least some of the conductive regions of the carrier substrate,
    wherein each of the solder structures in the plurality of solder structures have a dimension greater than the thicknesses of the optical emitter device and the optical receiver device.

2. The optocoupler package of claim 1 further comprising a dam structure disposed on the carrier substrate and around the optical emitter device and the optical receiver device.

3. The optocoupler package of claim 1 further comprising a first wire coupling the optical emitter device to one of the plurality of conductive regions and further comprising a second wire coupling the receiver device to one of the plurality of conductive regions on the carrier substrate.

4. The optocoupler package of claim 1 further comprising a reflective coating on the optically transmissive medium.

5. An optocoupler package comprising:
   a) a carrier substrate including a plurality of conductive regions;
   b) an optical emitter device on the carrier substrate;
   c) a first wire coupling the optical emitter device to at least one of the plurality of conductive regions;
   d) an optical receiver device on the carrier substrate, wherein the optical receiver device is adapted to receive radiation from the optical emitter device;
   e) a second wire coupling the optical receiver device to at least one of the conductive regions;
   f) an optically transmissive medium disposed on and between the optical emitter device and the optical receiver device; and
   g) a plurality of solder structures on at least some of the conductive regions in the plurality of conductive regions and wherein each of the solder structures includes a dimension greater than the thicknesses of the optical receiver device and the optical emitter device.

6. The optocoupler package of claim 5 wherein the carrier substrate comprises a ceramic material.

7. The optocoupler package of claim 5 wherein the optically transmissive medium comprises silicone.

8. The optocoupler package of claim 5 wherein the plurality of solder structures is disposed around the optical emitter device, the optical receiving device, and the optically transmissive medium.

9. An optocoupler apparatus comprising:
   a) a circuit substrate comprising a first plurality of conductive regions; and
   b) an optocoupler package comprising (i) a carrier substrate, (ii) a second plurality of conductive regions on the carrier substrate, (iii) an optical receiver device on the carrier substrate, (iv) an optical emitter device on the carrier substrate, (v) an optically transmissive medium disposed between the optical emitter device and the optical receiver device, and (vi) a plurality of solder structures on at least some of the second plurality of conductive regions of the carrier substrate,
   wherein the optocoupler package is mounted to the circuit substrate, and
   wherein each of the plurality of solder structures has a height greater than the heights of the optical emitter device and the optical receiver device.

10. The optocoupler apparatus of claim 9 wherein the optical emitter device and optical receiver device are between the circuit substrate and the carrier substrate.

11. The optocoupler apparatus of claim 9 wherein a gap is present between the optically transmissive medium and the circuit substrate.

12. A method for forming an optocoupler package comprising:
   a) mounting an optical emitter device on a carrier substrate with a plurality of conductive regions;
   b) mounting an optical receiver device on the carrier substrate;
   c) forming an optically transmissive medium on the optical emitter device and the optical receiver device; and
   d) forming a plurality of solder structures on at least some of the conductive regions of the carrier substrate,
   wherein each of the plurality of solder structures has a height greater than the heights of the optical emitter device and the optical receiver device.

13. The method of claim 12 wherein the plurality of solder structures comprise solder balls.

14. The method of claim 12 wherein forming the plurality of solder structures comprises:
   depositing a plurality of solder deposits on at least some of the conductive regions on the carrier substrate; and
   reflowing the solder deposits.

15. The method of claim 12 wherein step d) is performed after step c).

16. A method for forming an optocoupler apparatus comprising:
   a) forming the optocoupler package according to the method of claim 12; and
   b) mounting the optocoupler package on a circuit substrate.

17. A surface mountable optocoupler package comprising:
   a) a carrier substrate including a plurality of conductive regions;
   b) an optical emitter device on the carrier substrate;
   c) an optical receiver device on the carrier substrate;
   d) an optically transmissive medium disposed between the optical emitter device and the optical receiver device; and
   e) a plurality of conductive structures on at least some of the conductive regions of the carrier substrate,
   wherein the surface mountable optocoupler package is capable of being mounted to a circuit structure, and
   wherein each of the plurality of conductive structures has a height greater than the heights of the optical emitter device and the optical receiver device.

18. The surface mountable optocoupler package of claim 17 wherein the plurality of conductive structures includes a plurality of conductive columns.

19. The surface mountable optocoupler package of claim 17 wherein the circuit structure is a printed circuit board.

\* \* \* \* \*

UNITED STATES PATENT AND TRADEMARK OFFICE
CERTIFICATE OF CORRECTION

PATENT NO. : 6,633,030 B2
DATED : October 14, 2003
INVENTOR(S) : Joshi

It is certified that error appears in the above-identified patent and that said Letters Patent is hereby corrected as shown below:

<u>Title page,</u>
Item [73], Assignee, please correct the Assignee to read:
-- Fairchild Semiconductor, South Portland, ME (US) --.

Signed and Sealed this

Seventeenth Day of February, 2004

JON W. DUDAS
*Acting Director of the United States Patent and Trademark Office*